(12) United States Patent
Shen et al.

(10) Patent No.: US 7,739,877 B2
(45) Date of Patent: Jun. 22, 2010

(54) METHOD AND SYSTEM FOR REDUNDANT THERMOELECTRIC COOLERS FOR INTEGRATED DWDM TRANSMITTER/RECEIVER

(75) Inventors: Xiao Andy Shen, San Bruno, CA (US); Yu Sheng Bai, Los Altos Hills, CA (US)

(73) Assignee: FutureWei Technologies, Inc., Plano, TX (US)

( * ) Notice: Subject to any disclaimer, the term of this patent is extended or adjusted under 35 U.S.C. 154(b) by 208 days.

(21) Appl. No.: 11/858,061

(22) Filed: Sep. 19, 2007

(65) Prior Publication Data

US 2008/0134689 A1 Jun. 12, 2008

Related U.S. Application Data

(60) Provisional application No. 60/868,885, filed on Dec. 6, 2006.

(51) Int. Cl.
*F25B 21/02* (2006.01)
*F25D 23/12* (2006.01)

(52) U.S. Cl. ............................. 62/3.2; 62/259.2; 62/3.7
(58) Field of Classification Search ................. 62/3.2, 62/3.7, 259.2
See application file for complete search history.

(56) References Cited

U.S. PATENT DOCUMENTS

| | | | | |
|---|---|---|---|---|
| 3,204,418 | A | * | 9/1965 | Mathews ........................ 62/3.3 |
| 5,349,821 | A | * | 9/1994 | Schrage ........................ 62/3.7 |
| 6,377,725 | B1 | * | 4/2002 | Stevens et al. ................. 385/24 |
| 6,539,725 | B2 | * | 4/2003 | Bell ............................. 62/3.7 |
| 6,556,752 | B2 | | 4/2003 | Fang et al. |

(Continued)

FOREIGN PATENT DOCUMENTS

CN 1287542 A 3/2001

(Continued)

OTHER PUBLICATIONS

Huang et al., "Performance and Reliability of Redundant Thermoelectric Coolers", Electronic Components and Technology Conference, 1991. Proceedings., 41st volume , Issue , May 11-16, 1991 pp. 34-37.

(Continued)

*Primary Examiner*—Thomas E Denion
*Assistant Examiner*—Michael Carton
(74) *Attorney, Agent, or Firm*—Townsend and Townsend and Crew

(57) ABSTRACT

A thermoelectric cooler apparatus for a fiber optic system includes a first plate coupled to the fiber optic system and a second plate for coupling to a heat sink. The apparatus includes a first plurality of thermoelectric units and a second plurality of thermoelectric units being sandwiched between the first plate and the second plate for enhancing or retarding a heat transfer between the first plate and the second plate. The first plurality of thermoelectric units is connected to each other electrically in series. The second plurality of thermoelectric units is connected to each other electrically in series but insulated from the first plurality of thermoelectric units. The first plurality of thermoelectric units and the second plurality of thermoelectric units are configured such that a cross-section of the apparatus includes one or more of the second plurality of thermoelectric units being sandwiched by the first plurality of thermoelectric units.

25 Claims, 10 Drawing Sheets

U.S. PATENT DOCUMENTS

2001/0052234 A1* 12/2001 Venkatasubramanian ...... 62/3.2
2004/0081410 A1 4/2004 Aronson et al.
2005/0100290 A1 5/2005 Huang
2005/0210883 A1* 9/2005 Bell ............................ 62/3.2

FOREIGN PATENT DOCUMENTS

EP 1 436 931 B1 12/2005
JP 6-89955 A 3/1994

OTHER PUBLICATIONS

Hashimoto et al., "Multichip Optical Hybrid Integration Technique with Planar Lightwave Circuit Platform", Journal of Lightwave Technology, vol. 6, No. 7, Jul. 1998.

Henry et al., "Glass Waveguides on Siliconfor Hybrid Optica; Packaging", Journal of Lightwave Technology, vol. 7, No. 10, Oct. 1999.

Ohyama et al., "4-Channel x 10-Gbit/s Hybrid INTEGRATED Multiwavelength Laser Module Using Silica-Based Planar Lightwave Circuit Platform with 1.5%Δ", Conference: European conference on optical communication; ECOC 2002—28th European Conference on Optical Communication , 2002; 28th Conf; vol. 2 p. 5.4.1; COM, Technical University of Denmark,, 2002 Sponsor: Danmarks tekniske universitet Location: Copenhagen, Denmark, 2002; Sep.

Lackovic et al., "Sensitivity Analysis of Component Failures in the Switched WDM Network", In Proceedings of Optical Networking Design and Modeling (ONDM) (Ghent, Belgium, Feb. 2-4, 2004), pp. 205-224.

Nagarajan et al., "Large -Scale Photonic Integrated Circuits", IEEE Journal of Selected Topics in Quantum Electronics, vol. 11, No. 1, Jan./ Feb. 2005.

International Search Report and Written Opinion of PCT Application No. PCT/CN2007/071128, date of mailing Mar. 20, 2008, 14 pages total.

* cited by examiner

-- Prior Art --

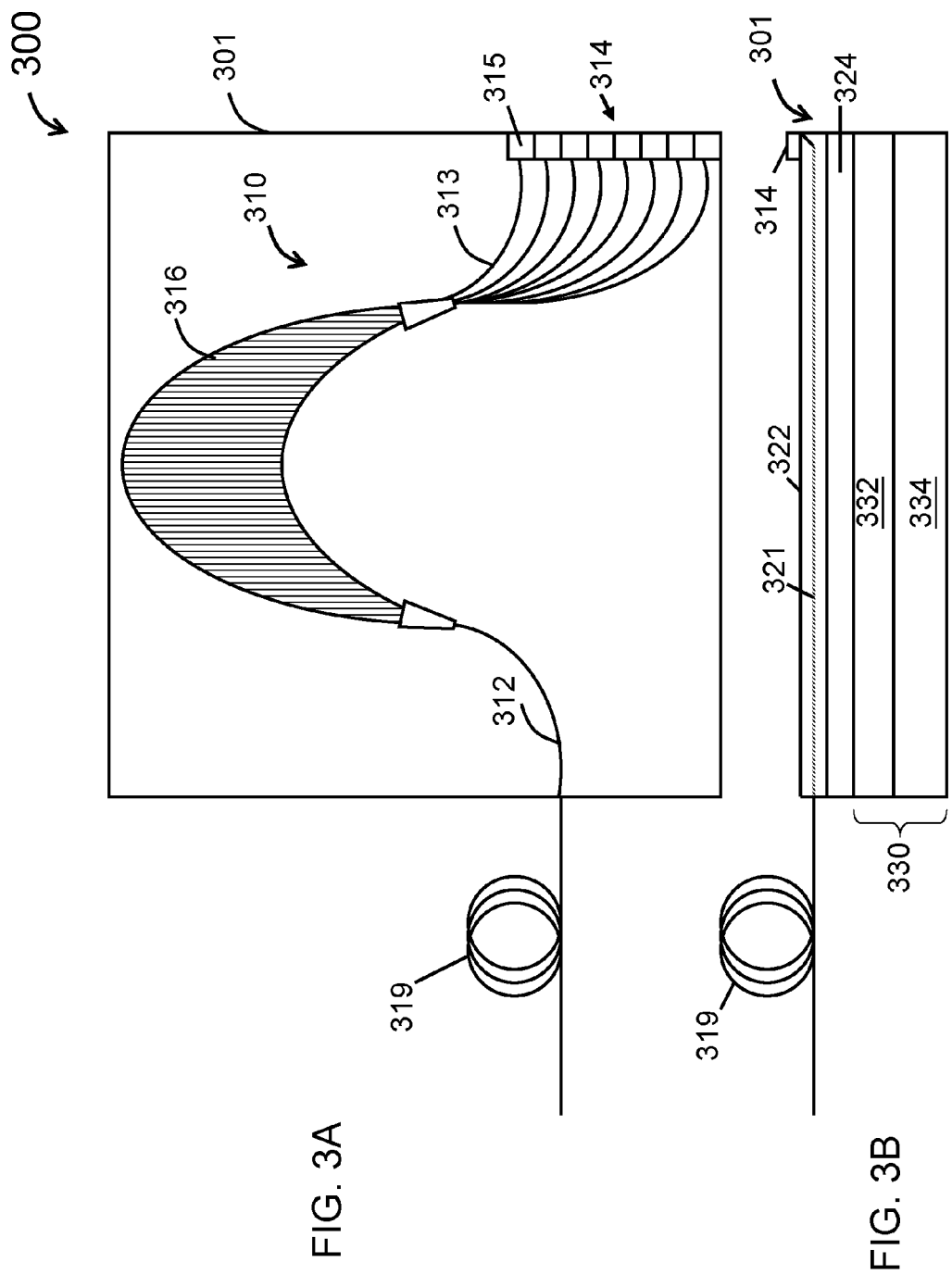

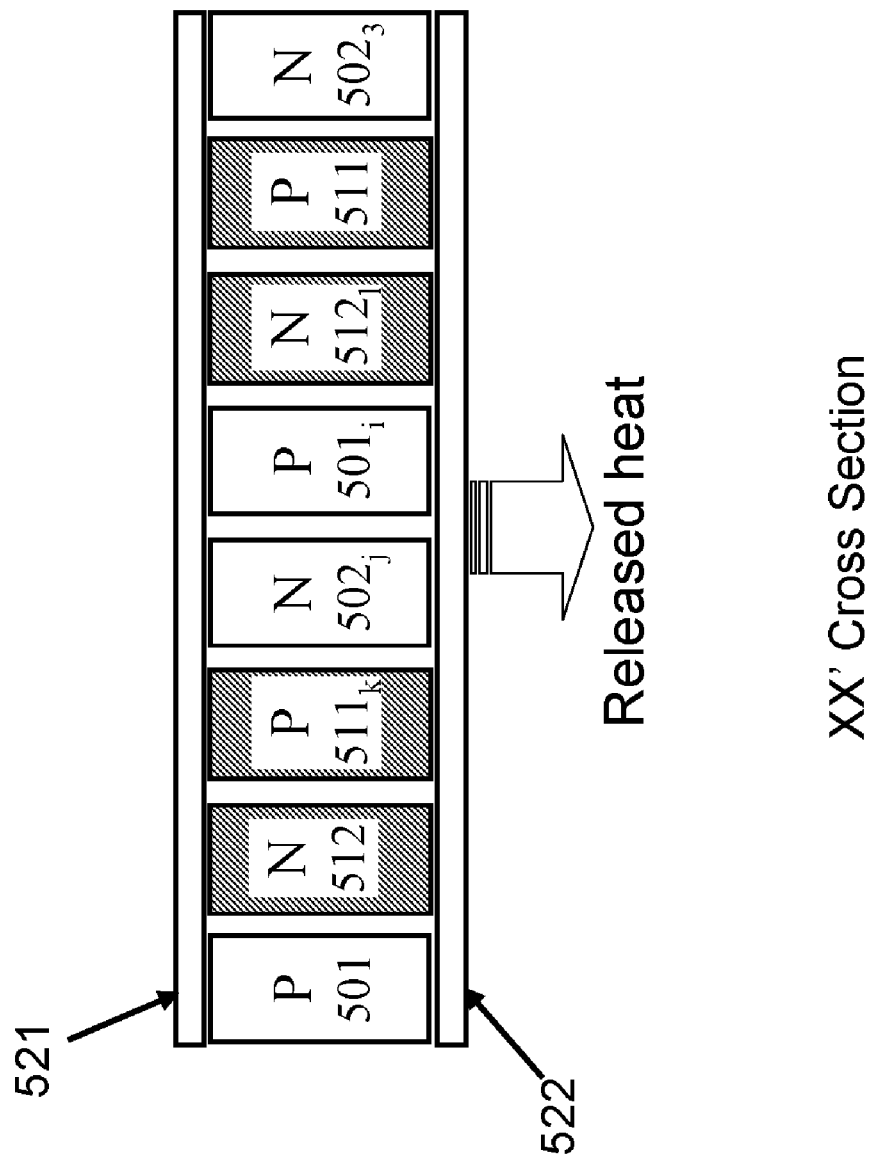

METHOD AND SYSTEM FOR REDUNDANT THERMOELECTRIC COOLERS FOR INTEGRATED DWDM TRANSMITTER/RECEIVER

CROSS-REFERENCES TO RELATED APPLICATIONS

This application claims priority to U.S. Provisional Patent Application No. 60/868,885, filed Dec. 6, 2006, commonly assigned, incorporated by reference herein for all purposes. This application is related to U.S. patent application Ser. Nos. 11/696,472 and 11/829,295, both of which are commonly assigned and incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to fiber optic transport systems. Embodiments of the invention provide methods and system for improving reliability of fiber optic transport system using an interleaving dual thermoelectric coolers (TEC) configuration. Merely by way of example, the invention has been applied to dense-wavelength-division-multiplexing (DWDM) fiber optic transport system with integrated transmitter/receiver module. But it would be recognized that the invention has a much broader range of applicability.

Since its first deployment in the middle of 1990s, dense wavelength division multiplexing (DWDM) has become a dominant technology for long haul and regional backbone transport networks, and is gradually making its way to metro area networks. In a conventional DWDM system, each optical component, be it a laser or a MUX filter, is individually packaged. A linecard is built around one or several optical components. For example, a transmitter card for a given wavelength includes a laser and a modulator (or an integrated laser/modulator). The laser chips sitting inside the laser packages are typically made of indium phosphide (InP) semiconductor compounds. The optical outputs of multiple transmitter linecards at different wavelengths are combined through a multiplexer linecard, which includes some MUX filters. A commonly used MUX filter is based on array waveguide grating (AWG) made of silica-on-silicon. The optical connections between the linecards are through optical fibers. The optical output from the multiplexer linecard is then amplified by an erbium doped fiber amplifier (EDFA) and launched into the transmission fiber. The optical outputs from the demultiplexer linecard, each at a wavelength by the ITU-T standards, are then fed into the receiver linecards. The optical connections between the linecards are generally made through optical fibers. A receiver card typically includes a photodetector, for example, a p-i-n (PIN) photodiode, or an avalanche photodiode (APD), that converts the input optical into an electrical signal for further processing. The photodetector chips inside the photodetector packages are typically made of InP semiconductor compounds.

Extensive efforts have been devoted recently to the integration of multiple transmitters/receivers along with AWG-based multiplexers and demultiplexers for its use in DWDM transport applications as a single integrated Tx/Rx module with the intent to reduce system footprints as well as the cost of Optical-Electrical-Optical (OEO) converter system. For example, ten transmitters and/or receivers, each operating at 10 G, have been successfully integrated in to a single line card with only one pair of fibers for line side connection. One of the drawbacks is its low yield and hence high cost. Different integration schemes have been proposed, including hybrid integration on silica/silicon which shows the promise of reducing the manufacturing cost.

One of the important applications of the integrated Tx/Rx module is to replace existing EDFAs in an optic network to have an OEO converter at every point of presence (PoP). This replacement has numerous advantages including the elimination of optical power management in the physical layer, simple and efficient network protection, and its flexibility/scalability. However, without protection, full OEO converter including such integrated Tx/Rx module will have much lower reliability than that of an EDFA. Even if 1:N protection is provided, there is still a need to further improve the reliability of the integrated Tx/Rx modules for them be used to replace EDFA at every PoP. The reliability of such integrated Tx/Rx module needs to be at least comparable to or better than that of EDFA to make the above replacement viable.

As a matter of fact, the total downtime of the DWDM fiber optic transport system has been bottlenecked due to the reliability of the integrated Tx/Rx modules which often need temperature control using thermoelectric coolers (TEC) because the lasers and the photo receivers work much better at lower temperatures. The failure mechanism for these devices is often associated with the failure of the TECs which eventually leads to malfunction or damage of the laser chips and receiver diodes.

FIG. 1 is a schematic view diagram of a conventional TEC module. As shown, the TEC module includes two plates made of heat conductive ceramics that is also a good electrical insulator. As shown, a series of P- and N-doped thermoelectric semiconductor elements or blocks is alternatively disposed and sandwiched between the two plates 101 and 103. Most TEC module is fabricated with a equal number of N-type and P-type blocks where one P and N block pair form a thermoelectric unit or couple which is usually called a Peltier diode. The series of Peltier diodes or alternating P-type and N-type thermoelectric semiconductor blocks are connected electrically in series and thermally in parallel. For example, any P-type/N-type block in the series may be connected its one end electrically, by a conductor 111 that is in thermal contact with one plate, to a corresponding end of only one neighboring N-type/P-type block. The same P-type/N-type block may be connected its opposite end electrically, by another conductor 113 that is in thermal contact with the other plate, to a corresponding end of another neighboring N-type/P-type block. When a DC voltage is applied to the TEC module, it causes a DC current to flow from an in-terminal 121 to an out-terminal 123, through each P-type block in a direction from one plate to another and alternatively through each N-type block in an opposite direction, resulting a Peltier effect, i.e., a current induced net heat transfer from one plate to another. As shown in FIG. 1, the TEC module in operation would make one plate 103 hot and the other plate 101 cold. Reversing the voltage polarity will reverse the heat transfer direction the first plate will now get cold and the second plate turns hot. When applying the TEC for active cooling, the "hot" plate 103 of the TEC module usually is mounted onto a heat sink, while the cold plate 101 of the TEC module is used for mounting a target system whose temperature needs to be controlled.

However, the TECs often have relative high failure rate. As a result, the failure rate of the integrated Tx/Rx module may be limited by the TECs used. Therefore, in order to make the integrated Tx/Rx module viable versus EDFAs in the optical transport system, it is desirable to improve the reliability of the thermoelectric cooler so that the full OEO converter reliability is at least comparable to or better that of an EDFA unit. Particularly, redundancy is considered to be useful to enhance the reliability.

As seen above, TEC failure is a bottleneck in reliability of the integrated Tx/Rx module in optical networks with frequent OEO conversions. Therefore, improved techniques for increasing TEC reliability are desired.

BRIEF SUMMARY OF THE INVENTION

The present invention is directed to fiber optic transport systems. Embodiments of the invention provide methods and system for improving reliability of fiber optic transport system using an interleaving dual thermoelectric coolers (TEC) configuration. Merely by way of example, the invention has been applied to DWDM fiber optic transport system with integrated transmitter/receiver module. But it would be recognized that the invention has a much broader range of applicability.

In a specific embodiment, the invention provides a thermoelectric cooler apparatus for a fiber optic system. The apparatus includes a first plate coupled to the fiber optic system and a second plate for coupling to a heat sink. Additionally, the apparatus includes a first plurality of thermoelectric units being sandwiched between the first plate and the second plate. The first plurality of thermoelectric units is connected to each other electrically in series. The apparatus further includes a second plurality of thermoelectric units being sandwiched between the first plate and the second plate. The second plurality of thermoelectric units is connected to each other electrically in series. Moreover, the first plurality of thermoelectric units is electrically insulated, at least within the thermoelectric cooler apparatus, from the second plurality of thermoelectric units. The first plurality of thermoelectric units is configured to enhance or retard a heat transfer between the first plate and the second plate in response to a first current flowing through the first plurality of thermoelectric units. The second plurality of thermoelectric units is configured to enhance or retard the heat transfer between the first plate and the second plate in response to a second current flowing through the second plurality of thermoelectric units. Furthermore, the first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units.

In another specific embodiment, the invention provides a thermoelectric cooler apparatus for a fiber optic system. The apparatus includes a first plate coupled to the fiber optic system and a second plate for coupling to a heat sink. The apparatus further includes a first plurality of thermoelectric units being sandwiched between the first plate and the second plate. The first plurality of thermoelectric units is connected to each other electrically in series. Additionally, the apparatus includes a second plurality of thermoelectric units being sandwiched between the first plate and the second plate. The second plurality of thermoelectric units is connected to each other electrically in series. According to embodiments of the invention, the first plurality of thermoelectric units is electrically insulated, at least within the thermoelectric cooler apparatus, from the second plurality of thermoelectric units. The first plurality of thermoelectric units is configured to enhance or retard a heat transfer between the first plate and the second plate in response to a first current flowing through the first plurality of thermoelectric units. Moreover, the second plurality of thermoelectric units is configured to enhance or retard the heat transfer between the first plate and the second plate in response to a second current flowing through the second plurality of thermoelectric units. The first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units. The apparatus further includes a first thermistor coupled to the first plate and configured to output a first temperature signal and a second thermistor coupled to the first plate and configured to output a second temperature signal. Furthermore, the apparatus includes a processing apparatus configured to receive the first temperature signal and the second temperature signal. The processing apparatus also is configured to process information associated with a predetermined temperature, the first temperature signal, and the second temperature signal. The processing apparatus further is configured to adjust the first current based on at least the first temperature signal and the second temperature signal or based on a change in the second current.

In an alternative embodiment, the invention provides a method for providing thermoelectric cooling for a fiber optic system. The method includes coupling a thermoelectric cooler apparatus with the fiber optic system. The thermoelectric cooler apparatus includes a first plate coupled to the fiber optic system and a second plate coupled to a heat sink. The thermoelectric cooler also includes a first plurality of thermoelectric units being sandwiched between the first plate and the second plate. The first plurality of thermoelectric units is connected to each other electrically in series. The thermoelectric cooler further includes a second plurality of thermoelectric units being sandwiched between the first plate and the second plate. The second plurality of thermoelectric units is connected to each other electrically in series. Additionally, the second plurality of thermoelectric units is insulated, at least within the thermoelectric cooler apparatus, from the first plurality of thermoelectric units. The first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units. Moreover, the method includes receiving a first temperature signal from a first thermistor coupled to the first plate and receiving a second temperature signal from a second thermistor coupled to the first plate. The method further includes processing information associated with a predetermined temperature, the first temperature signal, and the second temperature signal. Furthermore, the method includes adjusting a first current flowing through the first plurality of thermoelectric units based on at least the first temperature signal and the second temperature signal or based on a change in a second current that is flowing through the second plurality of thermoelectric units.

Many benefits are achieved by way of the present invention over conventional techniques. For example, according to embodiments of the invention, a method and system is provided for improving the reliability of integrated Tx/Rx modules in DWDM fiber optic transport applications. In one embodiment, the invention removes the reliability bottleneck of the network where these modules are used for full OEO at each PoP. In another embodiment, the invention also can be used with individual transponders to further improve their reliability in applications such as OEO converters that may be an optional replacement of EDFAs. In various embodiments of the invention, the new design of the TEC with dual drivers uses existing technologies and manufacturing processes without substantial modification. In one embodiment, the TEC based on interleaved configuration of two redundant sets of thermoelectric units can effectively control the temperature of a target plate in whole area even with only one set of thermoelectric units in operation while the other set is available anytime if necessary, particularly when the first set failed. Alternatively, the two sets of thermoelectric units may be operated at the same time each with half power so that effectively enhances the device life time or reduces failure rate. Depending upon the embodiment, one or more of these benefits, as well as other benefits, may be achieved. These and other benefits will be described in more detail throughout the present specification and more particularly below in conjunction with the following drawings.

BRIEF DESCRIPTION OF THE DRAWINGS

FIG. 3A is a simplified top view diagram of a hybrid integrated DWDM receiver according to an embodiment of the present invention;

FIG. 3B is a simplified cross-sectional view diagram of the hybrid integrated DWDM receiver of FIG. 3A according to the above embodiment of the invention;

FIG. 5C shows one schematic cross section view along an XX' cut of the exemplary interleaving dual TEC in FIG. 5A according to one embodiment of the present invention;

DETAILED DESCRIPTION OF THE INVENTION

The present invention is directed to fiber optic transport systems. Embodiments of the invention provide methods and system for improving reliability of fiber optic transport system using an interleaving dual thermoelectric cooler (TEC) configuration. Merely by way of example, the invention has been applied to DWDM fiber optic transport system with integrated transmitter/receiver module. But it would be recognized that the invention has a much broader range of applicability.

Figures 2A, 2B:
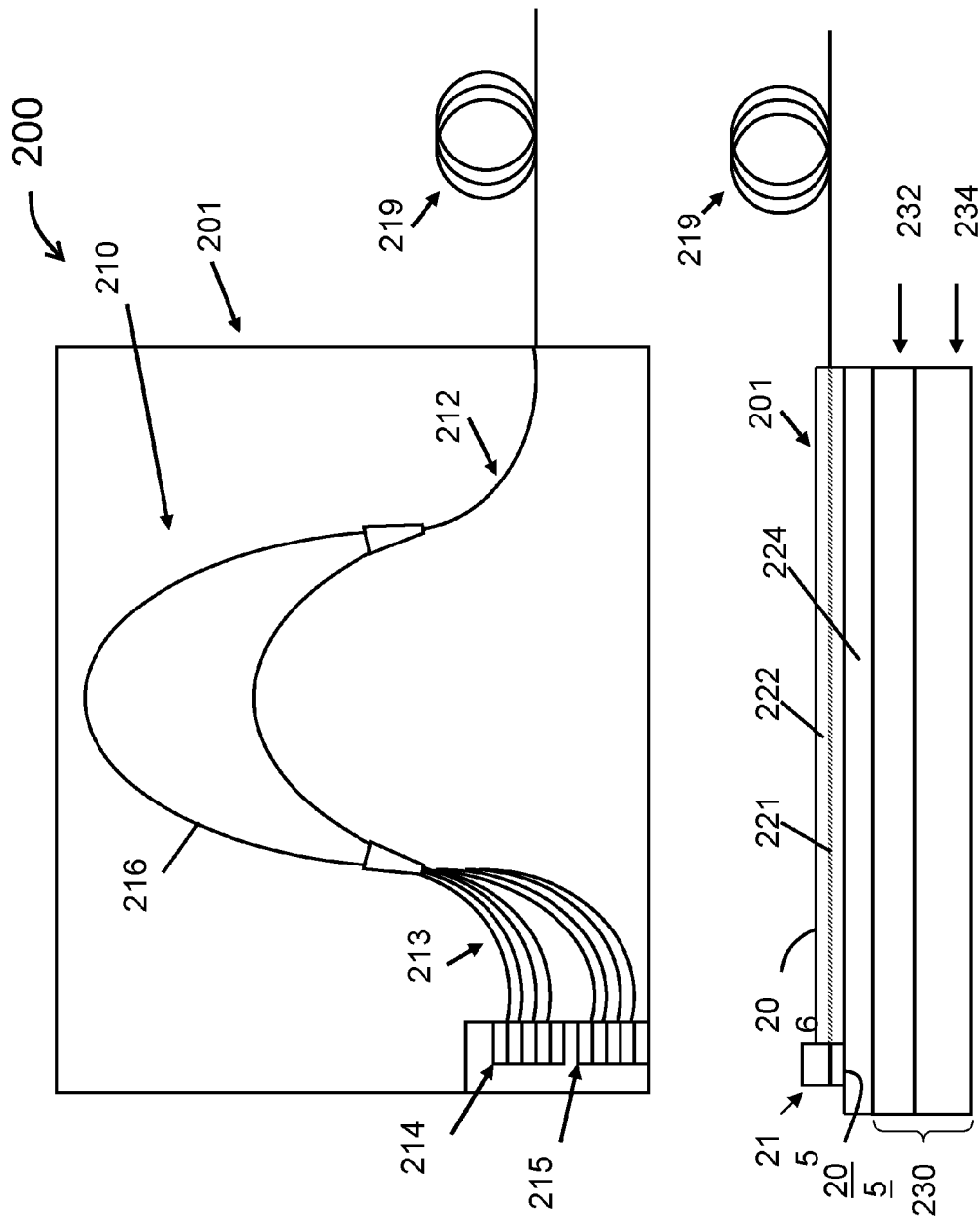
FIG. 2A is a simplified top view diagram of a hybrid integrated DWDM transmitter according to an embodiment of the present invention.
FIG. 2B is a simplified cross-sectional view diagram of the hybrid integrated DWDM transmitter of FIG. 2A according to an embodiment of the invention.

Certain embodiment provides a hybrid integrated DWDM transmitter (Tx) including one or more multiple direct-modulated laser (DML) array chips made of InP and an arrayed waveguide grating (AWG) made of silica-on-silicon planar lightwave circuit (PLC). FIG. 2A is a simplified top view diagram of a hybrid integrated DWDM Tx module according to an embodiment. This diagram is merely an example, which should not unduly limit the scope of the claims herein. One of ordinary skill in the art would recognize other variations, modifications, and alternatives. As shown, the hybrid integrated DWDM transmitter 200 includes a silicon bench 201. In a specific embodiment, the silicon bench 201 includes a silica-on-silicon substrate. The hybrid integrated DWDM Tx module 200 also includes an optical multiplexer in the silicon bench. In a specific embodiment, the optical multiplexer includes an arrayed waveguide grating (AWG) 210 made in a silica-on-silicon planar lightwave circuit (PLC) in the silicon bench. The hybrid integrated DWDM Tx module 200 further includes one or more multiple laser array chips, e.g., 214 and 215. In a preferred embodiment, the laser array chips include DML lasers made in InP. In a specific embodiment, each InP laser array chip includes two or more lasers. Of course, there can be other variations, modifications, and alternatives.

In a specific embodiment, the AWG 210 includes one optical output port 212, multiple input ports 213, and grating waveguides 216. In an embodiment, the output port 212 is optically coupled to an optical fiber 219, which may be coupled to an optical transmission system. The output and input ports, for example, can all be implemented in the form of waveguides. In a specific embodiment, the grating waveguides 216 include a number of waveguides for coupling to the input and output ports. These waveguides have varying lengths for performing wavelength division multiplexing and demultiplexing functions. In some embodiments, each input port of the AWG has a center wavelength and pass band associated with light transmission. In a specific embodiment, the center wavelength corresponds to a particular wavelength associated with a frequency defined by ITU-T standards, for example, 193.1 THz.

Figure 1:
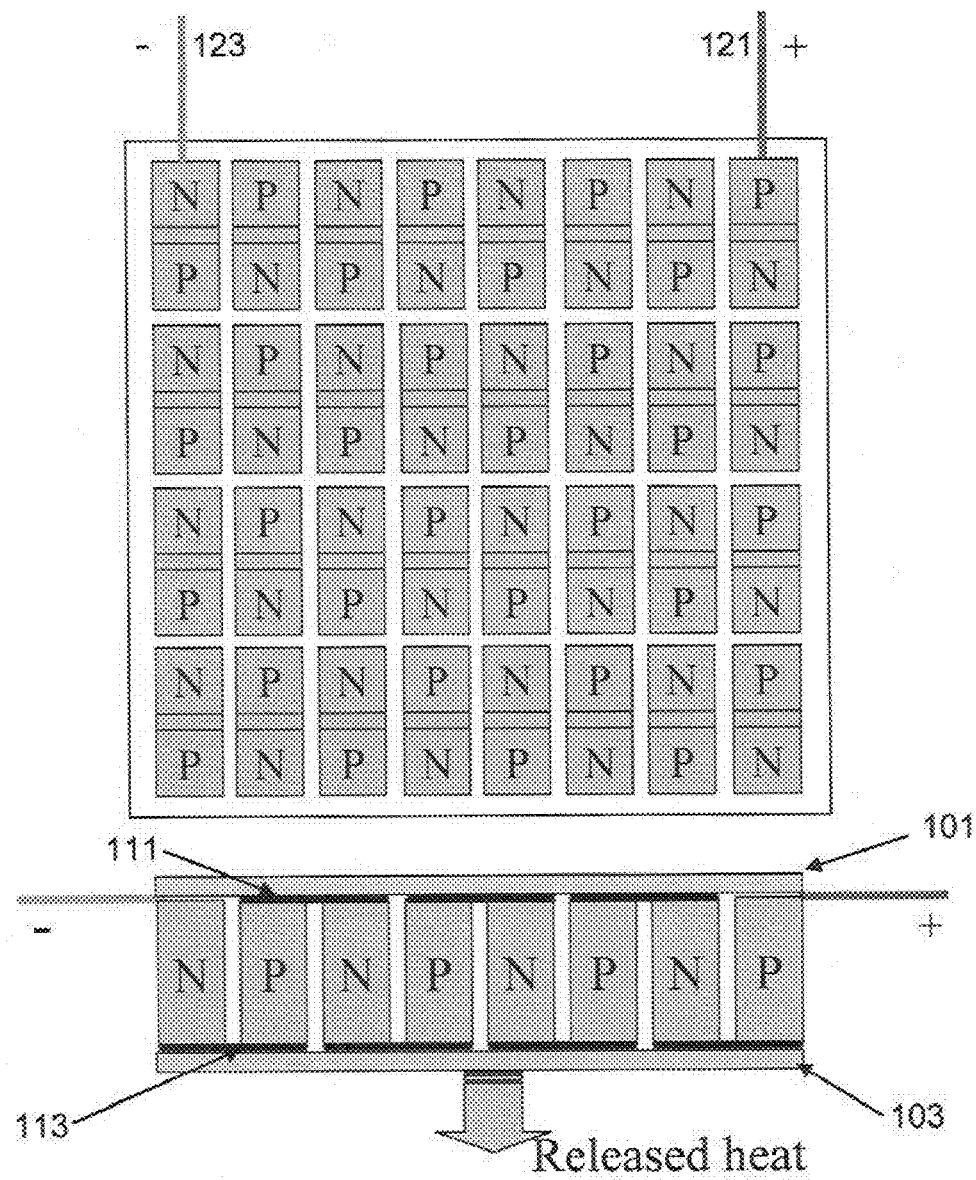
FIG. 1 is a view diagram of a conventional thermoelectric cooler (TEC).

FIG. 2B is a simplified cross-sectional view diagram of the hybrid integrated DWDM Tx module 200 according to an embodiment. This diagram is merely an example, which should not unduly limit the scope of the claims herein. One of ordinary skill in the art would recognize other variations, modifications, and alternatives. As shown, a waveguide includes doped silica region 221 enclosed in an undoped silica layer 222 on a silicon substrate 224. In a specific embodiment, the doped silica region 221 has a higher index of refraction than the undoped silica region. In one example, the doped silica region 221 has a index of refraction of about 1.47, and the undoped silica region has a index of refraction of about 1.45. In FIG. 1B, waveguide 221 is used to illustrate a cross sectional view of parts of waveguides in input port 213, grating waveguides 216, and output port 212.

According to certain embodiments, integrated transmitter 200 includes one or more laser array chips, and each laser array chip may include two or more lasers. In the specific embodiment shown in FIG. 2A, the integrated transmitter 200 includes two direct-modulated laser (DML) array chips 214 and 215. In this specific example, each of DML array chips 214 and 215 includes four direct-modulated lasers (DMLs)

made in InP. In one embodiment, the DMLs are of the types of distributed feedback (DFB) lasers and hence are operated in single frequency mode. In some embodiments, each DML works around a particular wavelength (frequency) defined by ITU-T standards, for example, 193.1 THz. Of course, one of ordinary skill in the art would recognize other variations, modifications, and alternatives.

As shown in FIG. 2A, according to some embodiments, the DML array chips are mounted on a portion of the silicon bench 201, in the vicinity of the input ports 213 of the AWG 210. In an embodiment, this mounting is performed using a p-side down, flip-chip method. Depending on the embodiment, other bonding methods using suitable adhesives can also be used. In FIG. 2B, the silicon bench 201 includes a silica-on-silicon substrate. A region of the silicon bench includes the AWG waveguide. In another region of the silicon bench, a portion of the silica is removed, and the DML array chips are mounted on the surface of the remaining silica over the silicon substrate. In another embodiment, the silica layer in a second region of the silicon bench is removed, and the DML array chips are mounted on the exposed silicon surface.

According to a specific embodiment, the silicon bench is mounted on a support component 230, as shown in FIG. 2B. In another specific embodiment, the support component 230 includes an optional submount 232 and a temperature adjustment component 234. The temperature adjustment component keeps the optical components such as the waveguides, the AWG and the DMLs at a suitable operating temperature, for example ~25° C. In one embodiment, the temperature adjustment component includes a thermoelectric cooler (TEC). In certain embodiments, integrated Tx module 100 also includes a micro heater in a proximity to each of the lasers for temperature adjustment. In an embodiment, at the operating temperature, the center wavelengths of the DMLs are matched approximately to those of the AWG input ports, for example, 193.1 THz, 193.2 THz, 193.3 THz, etc. Typically, the center wavelengths of the AWG can shift with temperature by ~0.01 nm/° C., and the center wavelengths of the InP lasers shift with temperature by ~0.1 nm/° C. In some embodiments, the support component 230 also includes a submount 232 on the temperature adjustment component 234. In an embodiment, the submount 232 is made of materials containing metal or ceramics which provide mechanic strength. The submount also has good thermal conductance as required for the temperature adjustment component to control the temperature of the optical components, such as the laser and waveguide.

Certain embodiments also provide a hybrid integrated DWDM receiver (Rx) with one or more multiple photodetector array chips made of InP surface mounted on an arrayed waveguide grating (AWG) made of silica-on-silicon planar lightwave circuit (PLC). FIG. 3A is a simplified top view diagram of a hybrid integrated DWDM Rx module according to an embodiment. This diagram is merely an example, which should not unduly limit the scope of the claims herein. One of ordinary skill in the art would recognize other variations, modifications, and alternatives. As shown, hybrid integrated DWDM Rx module 300 includes a silicon bench 301. In a specific embodiment, the silicon bench 301 includes a silica-on-silicon substrate. The hybrid integrated DWDM Rx module 300 also includes an optical demultiplexer in the silicon bench. In a specific embodiment, the optical demultiplexer includes an arrayed waveguide grating (AWG) 310 made in a silica-on-silicon planar lightwave circuit (PLC) in the silicon bench. The hybrid integrated DWDM Rx module 300 further includes one or more multiple photodetector array chips, e.g., 314. In one example, the photodetector array chips include photodetectors made in InP. In another example, each InP photodetector array chip includes one or more photodetectors, e.g. 315. Of course, there can be other variations, modifications, and alternatives.

In a specific embodiment, the AWG 310 includes one optical input port 312, multiple output ports 313, and grating waveguides 316. In an embodiment, the input port 312 is optically coupled to an optical fiber 319 for receiving a DWDM optical signal, which may be coupled to an optical transmission system. The output and input ports, for example, can all be implemented in the form of waveguides. In a specific embodiment, the grating waveguides 316 include a number of waveguides for coupling to the input and output ports. These waveguides have varying lengths for performing wavelength division multiplexing and demultiplexing functions. In a specific embodiment, each of the output ports outputs a demultiplexed optical signal. In some embodiments, each output port of the AWG has a center wavelength and pass band associated with light transmission. In a specific embodiment, the center wavelength corresponds to a particular wavelength associated with a frequency defined by ITU-T standards, for example, 193.1 THz.

FIG. 3B is a simplified cross-sectional view diagram of the hybrid integrated DWDM Rx module 300 according to an embodiment. This diagram is merely an example, which should not unduly limit the scope of the claims herein. One of ordinary skill in the art would recognize other variations, modifications, and alternatives. As shown, a waveguide includes doped silica region 321 enclosed in an undoped silica layer 322 on a silicon substrate 324. In a specific embodiment, the doped silica region 321 has a higher dielectric constant than the undoped silicon region. In another specific embodiment, the doped silica region 321 has a higher index of refraction than the undoped silica region. In a specific example, the doped silica region 321 has a index of refraction of about 1.47, and the undoped silica region has a index of refraction of about 1.45. In FIG. 3B, waveguide 321 is used to illustrate a cross sectional view of parts of waveguides in input port 312, grating waveguides 316, and output port 313.

According to certain embodiments, hybrid integrated DWDM Rx module 300 includes one or more photodetector array chips, and each photodetector array chip may include one or more photodetectors. In the specific embodiment shown in FIG. 3A, the hybrid integrated DWDM receiver 300 includes a photodetector array chip 314. In this specific example, the array chip includes eight photodetectors made in InP. In some embodiments, the photodetectors include p-i-n (PIN) photodiodes. In other embodiments, the photodetectors include avalanche photodiodes (APD). The use of surface illuminated APDs can lead to $\geq 10$ dB increase in receiving sensitivity, which enables long distance transmission without optical amplifiers. In conventional technologies, APDs have usually been used in individually packaged receivers. According to some embodiments, the photodetector arrays can also be single photodetector chips. A function of photodetectors is to convert each optical signal to a corresponding electrical signal output through an electrical lead (not shown in the drawing). Alternatively, the electrical signal can be amplified by a post amplifier before being sent out. The post amplifiers can either be mounted on the PLC, or on a separate substrate. Of course, one of ordinary skill in the art would recognize other variations, modifications, and alternatives.

As shown in FIG. 3A, according to some embodiments, the photodetector array chips are mounted on a portion of the silicon bench 301, in the vicinity of the output ports 313 of the AWG 310. In an embodiment, this mounting is performed using a surface mount process with metal solders, which provide both mechanical strength and electrical connections for the photodetectors. Depending on the embodiment, other bonding methods using suitable adhesives can also be used.

According to a specific embodiment, the silicon bench is mounted on a support component 330, as shown in FIG. 3B. The support component 330 includes a temperature adjustment component 334 and an optional submount 332. The temperature adjustment component keeps the optical components such as the waveguides, the AWG and the photodetectors at a suitable operating temperature, for example, from 20-50° C. In a specific embodiment, the temperature adjustment component includes a thermoelectric cooler (TEC). In an embodiment, at the operating temperature, the center wavelengths of the AWG output ports substantially fall on the ITU-T grids, for example, 193.1 THz, 193.2 THz, 193.3 THz, etc. Typically, the center wavelengths of the AWG can shift with temperature by ~0.01 nm/° C. In some embodiments, the support component 330 also includes a submount 332 on the temperature adjustment component 334. For example, the submount 332 is made of materials containing metal or ceramics which provide mechanic strength and thermal conductance.

Based on the described structures of the integrated DWDM Tx/Rx module and its intended applications for fiber optic transport system according to embodiments of the present invention, proper supporting components must be included. Particularly one or more temperature adjustment and control units are needed to ensure laser light being produced with a desired wavelength accuracy and minimized temperature shift, essentially improving reliability of the integrated Tx/Rx module with increased mean time to failure (MTTF). Embodiments of the present invention throughout the specification and particularly below show that a reliable temperature control for the integrated Tx/Rx module with self-protection can be achieved by advantageously interleaving dual TECs to provide protective redundancy. Each of the dual TECs simply includes a group of thermoelectric units such as Peltier diodes or couples based on existing technology.

Figure 4:
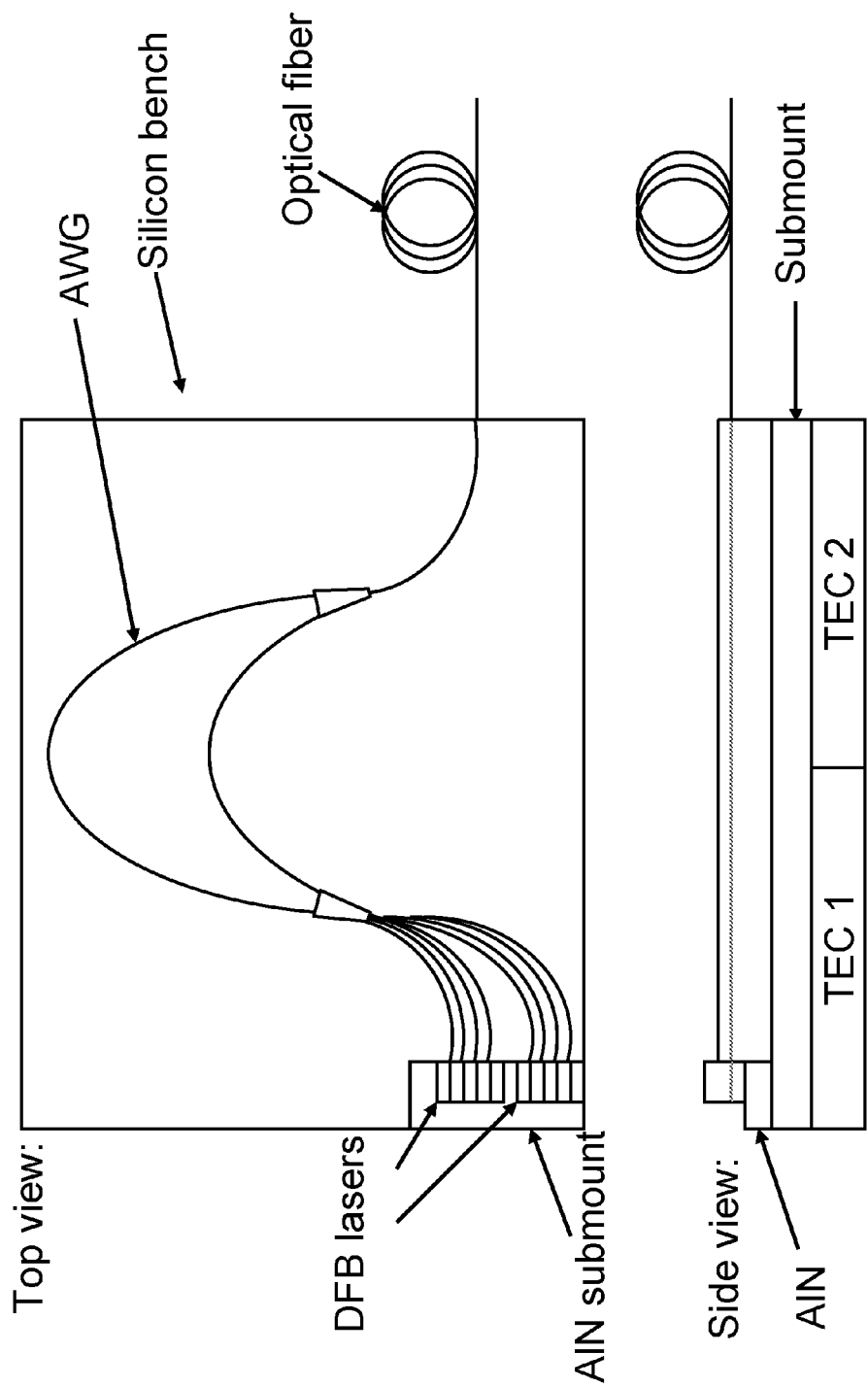
FIG. 4 is a simplified view diagram of an integrated transmitter module being cooled using two redundant TECs in a side-by-side configuration.

FIG. 4 is a simplified view diagram of an integrated transmitter module being cooled using two TECs in a side-by-side configuration. As shown, each of the two TECs are disposed directly in contact with roughly a half substrate area of a hybrid integrated Tx array chip. In case one TEC fails, the other can resume the operation automatically, increasing the MTTF of the module by a factor of two. However, because the chip to be cooled often has larger lateral dimensions compared to its thickness which relies on the whole lateral substrate area for heat transfer, cooling the chip with a small area TEC would be deficient. For example, in the case of a hybrid integrated 12-Tx array on silica, the thickness is around a few millimeters while the lateral dimensions are ~20×20 mm. Therefore, if one TEC fails, the cooling of the corresponding area (for example 10×20 mm) covered by the failed TEC can be limited by heat conduction through a thin cross section area determined by the chip thickness. Since the thermal resistance is proportional to l/s (where l is length of the chip and s is the cross section area of the chip), a large temperature gradient will be generated across the chip with higher temperature at the far end of the chip with failed TEC due to limited cooling power of the remaining TEC on the near end.

In another configuration, a vertical stack of two full lateral sized TECs may be applied (not shown). However, for a typical TEC made by crystalline bismuth-telluride material the thermal conductivity is relatively poor. If one in the two vertically stacking TECs is failed or non-operating, this TEC acts as a poor heat conductor, which would limit the efficiency of the other working TEC. Certain embodiment may provide an improved operation by running the TEC on top (that is directly in contact with the substrate to be cooled) at a low current, for example, at a current just sufficient to make it a good thermal conductor, so that it is much less likely to fail before the TEC at the bottom.

As discussed earlier, a typical TEC based on Peltier effect includes a number of thermoelectric units connected in series. Depending on size of each thermoelectric unit and the TEC package, the number of thermoelectric units may vary. Each thermoelectric unit can be a Peltier diode containing a pair of P-type and a N-type thermoelectric semiconductor blocks. Within a TEC package, these thermoelectric units are interconnected electrically in series (with one electric-in terminal and one electric-out terminal for the module), and thermally in parallel between a first plate and a second plate. In an specific embodiment, the present invention provides an interleaving dual TEC in a single package attached with a fiber optic system including DWDM integrated Tx/Rx module for improving system reliability. Particularly, instead of simply stacking side-by-side or vertically of two separately packaged TECs, two independent group of thermoelectric units are alternatively interleaved together into a single package with two shared thermal plates. Each group of thermoelectric units is interconnected electrically in series and can be supplied with a different DC current, but within the package each group of thermoelectric units is electrically insulated from the other group of thermoelectric units. Of course, there can be many variations, alternatives, and modifications. In one example, each thermoelectric unit in the interleaving dual TEC may be fabricated with a dimension as small as that allowed by a desired thermoelectric effect it can produce with sufficient current capacity. As the dimension of each thermoelectric unit becomes smaller, the number of the thermoelectric units in the module can be increased to enhance the area uniformity of each group of thermoelectric units as a whole group. In another example, the two groups of thermoelectric units may be geometrically configured in many different ways for each group to cover as much as possible the whole target area. In yet another example, the two TECs can be correlatively operated by two TEC drivers independently controlled by a single microprocessor. Further in another example, more than two TECs can be interleaved together into a single package. More details of various embodiments of the invention can be found throughout the specification and particularly below.

Figure 5A:
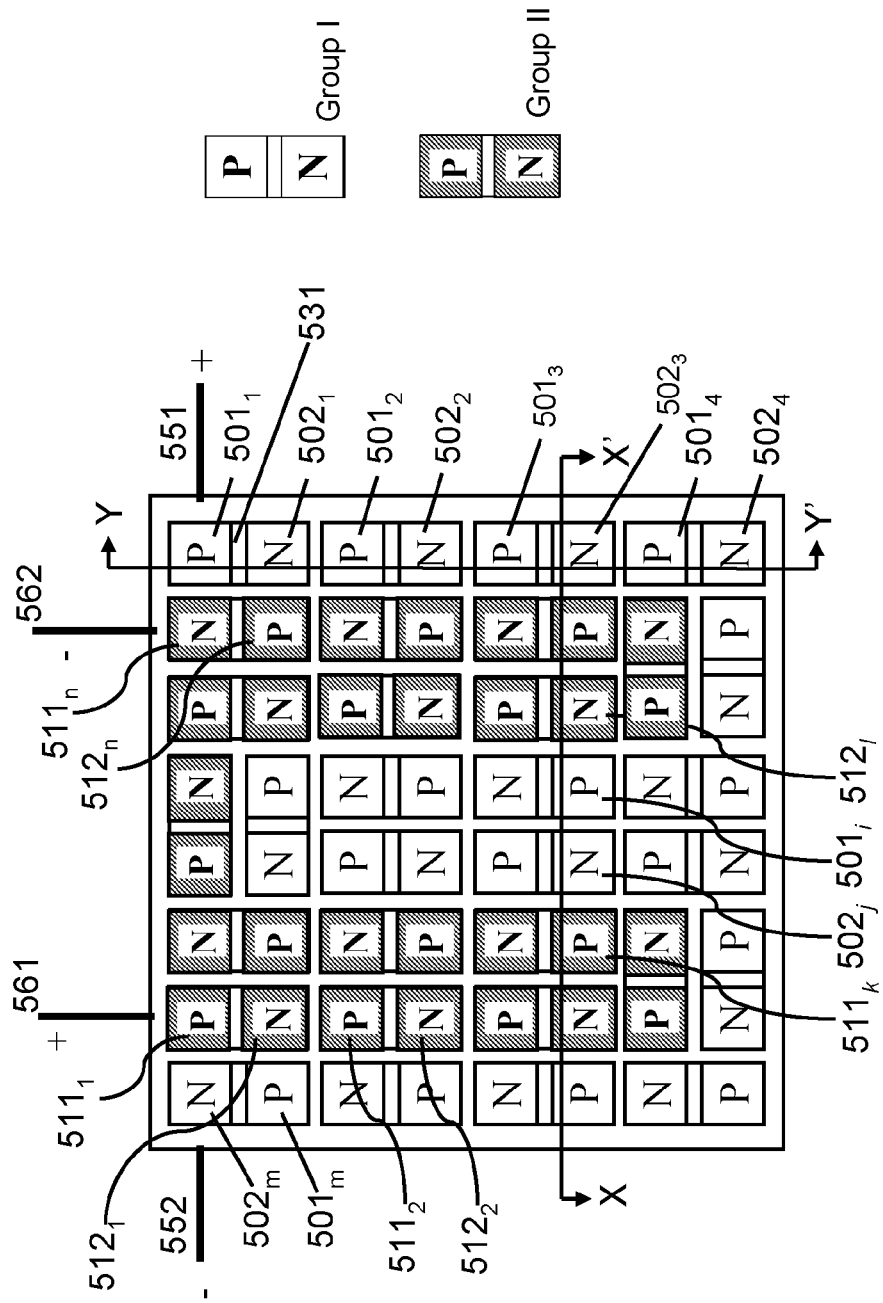
FIG. 5A is a schematic top view of an exemplary interleaving dual TEC according to one embodiment of the present invention.
Figure 5B:
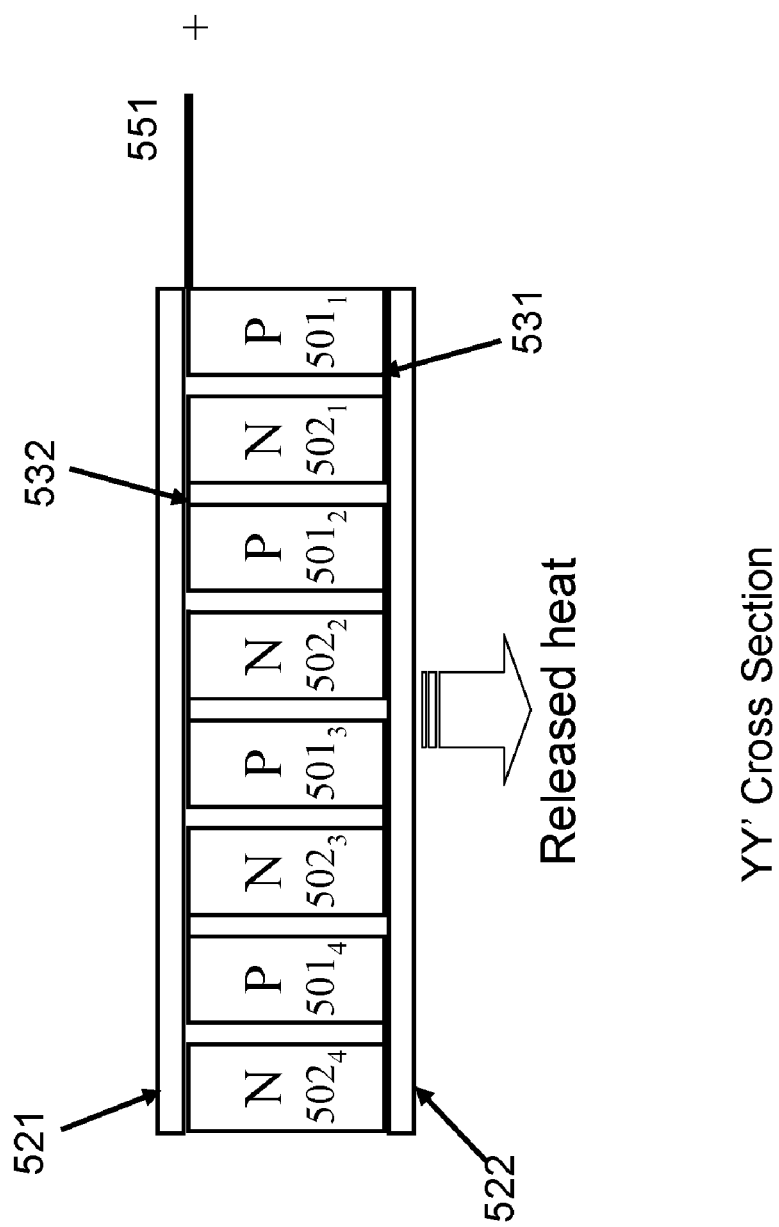
FIG. 5B shows one schematic cross section view along a YY' cut of the exemplary interleaving dual TEC in FIG. 5A according to one embodiment of the present invention.

FIGS. 5A-5C show schematic views of an exemplary interleaving dual TEC according to one embodiment of the present invention. These diagrams are merely examples, which should not unduly limit the scope of the invention herein. One of ordinary skill in the art would recognize other variations, modifications, and alternatives. As shown in FIG. 5A, a top view of the interleaving dual TEC 500 in a single package includes two independent groups, Group I and Group II, of alternating P- and N-type thermoelectric semiconductor blocks, each group being configured as a finger-like pattern and interleaved together. Group I includes a series of alternating P- and N-type blocks $501_1$, $502_1$, $501_2$, $502_2$, $501_3$, $502_3$, ... $501_m$, $502_m$, where m denotes an integer number representing a total number of the P-N block pairs within the Group I. All these m P-N pairs are connected electrically in series to each other while each P-N pair may form a Peltier diode. At least one block is connected to an electric-in terminal 551 and another block is connected to an electric-out terminal 552. Group II includes another series of alternating P- and N-type blocks $511_1$, $512_1$, $511_2$, $512_2$, $511_3$, $512_3$, ... $511_n$, $512_n$, where n denotes an integer number representing a total number of the P-N block pairs within the Group II. Each P/N block within the Group II may be substantially redundant to a P/N block in Group I in both the size and type of material, though this is not necessary and many variations or alternatives will not unduly limit the claims therein. All these n P-N block pairs or Peltier diodes are connected electrically in series to each other with at least one being connected with an electric-in terminal 561 and another one being connected with an electric-out terminal 562.

FIG. 5B shows a cross sectional view of the interleaving dual TEC along a YY' cut in FIG. 5A, including a row of alternating P- and N-type blocks $501_1$, $502_1$, $501_2$, $502_2$, $501_3$, $502_3$, $501_4$, $502_4$ being sandwiched between two plates 521 and 522 that are thermal conductive by electrical insulating. The electrical connections can be seen in series from a block to a neighboring block in the diagram. As shown, one end of the P-type block $501_1$ next to plate 521 is connected electrically to an electric-in terminal 551 but disconnected from the N-type block $502_1$. While the other end of the P-type block $501_1$ next to plate 522 is then connected to N-type block $502_1$ by a conductor 531 which is in thermal contact with plate 522. But the N-type block $502_1$ is disconnected from next P-type block $501_2$ near the plate 522. While the opposite end of the N-type block $502_1$ is further connected to the P-type block $501_2$ by another conductor 532 which is in thermal contact with plate 521. This alternating configuration of electrical connection continues through the whole group of P-N block pairs within the Group I. FIG. 5A in fact shows top view of plate 521 showing that P-type block $501_1$ is connected to N-type block $502_1$ by conductor 531 in contact with plate 521, while a gap between N-type block $502_1$ and P-type block $501_2$ is denoted because they are actually connected by conductor 532 in contact with plate 532 on the opposite side.

Referring again to the top view diagram of FIG. 5A, the series of P-N pairs $501_1$-$502_1$ through $501_m$-$502_m$ in Group I can be geometrically arranged in different directions while connecting electrically in series from one block to next according to certain embodiments of the present invention. As an example, FIG. 5A shows that a first finger-like configuration for Group I is formed. In one embodiment, the series of P-N pairs $511_1$-$512_1$ through $511_n$-$512_n$ in Group II also is connected electrically in series in a same way described above for the series of P-N pairs in Group I. Additionally, the series of P-N pairs $511_1$-$512_1$ through $511_n$-$512_n$ in Group II can be arranged geometrically in a similar way to form a second finger-like configuration that is properly interleaved with the first finger-like configuration to form the interleaving dual TEC 500 covering substantially whole area of the plate 521 and 522.

FIG. 5C shows another cross sectional view of the interleaving dual TEC 500 along an XX' cut in FIG. 5A, which illustrates a characteristic of the interleaved configuration between the Group I and Group II of thermoelectric units. In a specific embodiment, one cross section of the interleaving dual TEC includes one or more alternating P- and N-type thermoelectric semiconductor blocks in one independent group being sandwiched by blocks in another independent group. For example, the cross section view of XX' cut of the interleaving dual TEC 500 shows one P-type block $501_i$ of Group I next to a N-type block $502_j$ of Group I is sandwiched by a P-type block $511_k$ and a N-type block $512_l$ of Group II. In one embodiment, the one or more alternating P- and N-type thermoelectric semiconductor blocks in Group I, depending on particular cross section cut, may be directly connected to each other electrically in series. For example, the P-type block 501 and the N-type block $502_j$ may belong to one Peltier diode. In another embodiment, the one or more alternating P- and N-type thermoelectric semiconductor blocks in Group I, depending on particular cross section cut, may be connected indirectly through a number of other P and N blocks in the Group I. For example, the P-type block 501 may belong to one Peltier diode and the N-type block $502_j$ may belong to another Peltier diode, which are indirectly connected through the in-series electrical connection.

Figure 6:
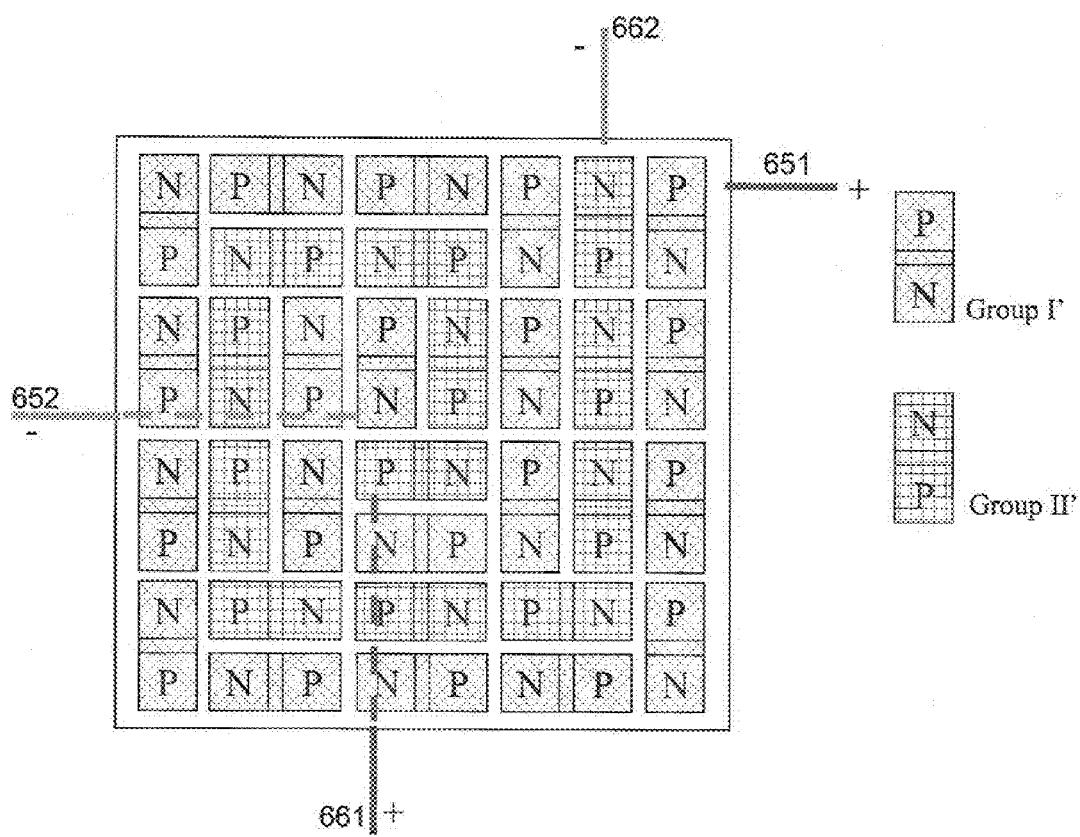
FIG. 6 is a schematic view of an exemplary interleaving dual TEC according to another embodiment of the present invention.

FIG. 6 show a schematic view of an exemplary interleaving dual TEC according to another embodiment of the present invention. This diagram is merely an example, which should not unduly limit the scope of the invention herein. One of ordinary skill in the art would recognize other variations, modifications, and alternatives. As shown, a top view of the interleaving dual TEC 600 in a single package includes two independent groups, Group I' and Group II', of alternating P- and N-type thermoelectric semiconductor blocks, each group being configured as a spiral-like pattern and interlaced together. In one example, each P-type/N-type thermoelectric semiconductor block in either Group I' and II' can be the same as a P-type/N-type thermoelectric semiconductor block in either Group I and II. In another example, all P-N block pairs in Group I' can be connected electrically in series in a similar way as that for all P-N pairs in Group I described before but form a first spiral configuration, with at least one block connects to an electric-in terminal 651 and one to an electric-out terminal 652. All P-N block pairs in Group II' also are connected electrically in series with at least one block connects to an electric-in terminal 661 and one to an electric-out terminal 662, forming a second spiral configuration. The first spiral configuration of Group I' and the second spiral configuration of Group II' of alternating P-type and N-type thermoelectric semiconductor blocks are properly interlaced each other to cover substantially the whole area shown in the top view of the interleaving dual TEC 600. The electric-in terminal 661 and the electric-in terminal 652 now are connected to a block located near the center of the package. In one specific embodiment, one cross section of the interleaving dual TEC includes one or more alternating P- and N-type thermoelectric semiconductor blocks in one independent group being sandwiched by blocks in another independent group. For example, a cross section cut XX' of the interleaving dual TEC 600 includes a P-N-P-N four blocks of Group I' sandwiched by a P-type and an N-type block of Group II'. Of course, there can be many variations, alternatives, and modifications in the interleaving arrangements of the two sets of the thermoelectric couples as long as the thermoelectric units in each group are distributed uniformly between the two thermal plates of the single TEC package in the absence of the other. Further, more than two groups of thermoelectric units can be used to form interleaving multiple redundant TECs if necessary.

Figure 7:
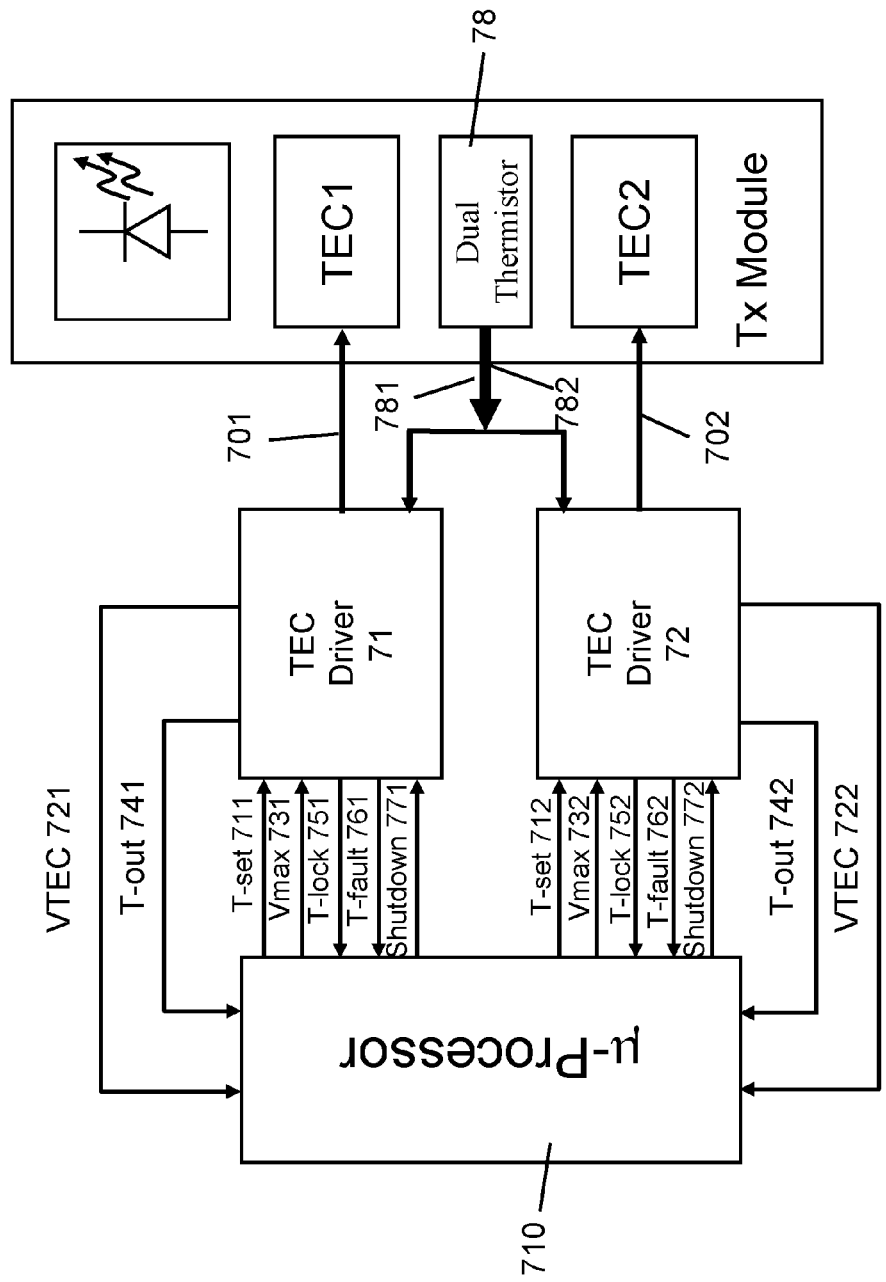
FIG. 7 is a simplified block diagram for a dual TEC controller according to an embodiment of the present invention.

FIG. 7 is a simplified block diagram for a dual TEC controller according to an embodiment of the present invention. This diagram is merely an example, which should not unduly limit the scope of the invention herein. One of ordinary skill in the art would recognize other variations, modifications, and alternatives. As shown, a dual TEC controller 600 is designed to use two redundant TECs, TEC1 and TEC2, in one package with shared thermal plate to maintain the fiber optic system at a specific temperature for desired operation wavelengths. For example, the two redundant TECs is formed by interleaving a first plurality of alternating P-type and N-type thermoelectric semiconductor blocks within the TEC1 and a second plurality of alternating P-type and N-type thermoelectric semiconductor blocks within the TEC2 based on an embodiment of the present invention. In one example, the interleaving dual TEC 500 shown in FIGS. 5A-5C is used. In another example, the interleaving dual TEC 600 shown in FIG. 6 is used.

According to certain embodiments, this dual TEC controller 700 relies on one or more negative-temperature-coefficient thermistors, e.g., a dual thermistor 78, to sense the temperatures of the system coupled to the fiber optic system that to be cooled. For example, the dual thermistor can be coupled to one thermal plate of the TEC package. In one specific embodiment, this dual TEC controller includes two TEC drivers, 71 and 72, each supplying a DC current, 701 or 702, independently to TEC1 or TEC2, to generate Peltier effect for active thermoelectric cooling. In another specific embodiment, the dual thermistor 68 is able to sent a first temperature signal 781 and a second temperature signal 782 to each of TEC driver 71 and TEC driver 72. The two TEC drivers can be substantially configured electronically in a same way and independently controlled by a single microprocessor 710. As shown in FIG. 7, the target temperature is set by the microprocessor 710 with an analog input voltage from, for example, a DAC T-set pin 711 and 712 respectively connected to TEC driver 71 and 72. The microprocessor 710 monitors an actual voltage across TEC1 by VTEC pin 721 through one ADC channel between TEC driver 71 and microprocessor 710 and a voltage across TEC2 by VTEC pin 722 through one ADC channel between TEC driver 72 and microprocessor 710. To protect the thermoelectric cooler from overload, microprocessor 710 can specify a maximum voltage and send to the Vmax pin 731 and 732 respectively for TEC1 and TEC2. Each of the T-out pin 741 and 742 is connected to the second ADC channel, allowing the TEC temperature to be dynamically monitored respectively for TEC1 and TEC2 and sent from the TEC driver 71 and 72 to microprocessor 710. In one embodiment, For TEC driver 71 or 72, two digital input signals are sent to the microprocessor 710, in which T-lock 751 or 752 indicates that the desired TEC temperature has been reached respectively for TEC1 and TEC2 and T-fault 761 or 762 is used to indicate a thermistor malfunction. One digital output SHUTDOWN signal 771 or 772 respectively for TEC driver 71 and 72, allowing TEC driver 71 or 72 to set either TEC1 or TEC2 at a low-current shutdown mode. Of course, there can be many variations, alternatives, and modifications.

In response to at least a first temperature signal 781 and a second temperature signal 782 from the dual thermistor 78, the TEC driver 71 is configured to adjust a first current 701 flowing through a first series of Peltier diodes of TEC1 and TEC driver 72 is configured to adjust a second current 702, independently, flowing through a second series of Peltier diodes of TEC2. In certain embodiment, the first current 701 and the second current 702 can be different in magnitude but one may be correlatively adjusted based the variation of the other. Depending on the embodiment, a positive or negative current is applied to the TEC, either heating or cooling the object as required. In an embodiment, an internal proportional-integral-derivative compensation amplifier can be used to stabilize the temperature.

In certain embodiments, the dual TEC controller can operate both TEC drivers to control an interleaving dual TEC apparatus with at least two failure modes. For example, the interleaving dual TEC apparatus is the interleaving dual TEC 500 shown in FIGS. 5A-5C. In one embodiment, when the two TECs within the interleaving dual TEC are in function simultaneously, each can be operated at half power or less to share the load. If one TEC fails, the other TEC can resume the full power. In another embodiment, only one TEC operates at a time until this TEC fails. Once that occurs, the corresponding TEC driver will receive a signal showing temperature shift from target temperature due to the failure of thermoelectric cooling provided by this TEC. The microprocessor then will be informed the failure through T-out signal or VTEC signal sent from the TEC driver. The microprocessor will immediately instruct the other TEC driver to switch on the second TEC which was originally in a low-current shutdown mode. In either mode, a careful calibration may be performed so that the temperature reading from two independent thermistors are consistent with each other at the target temperature. In an embodiment, this can be accomplished by choosing a first thermistor as a reference, measure the offset (if any) from the second thermistor and correct for the offset for the target temperature. The dual thermistor setup provides another layer of protection to ensure a reliable control process for the interleaving dual TEC. For example, if one thermistor fails to operate, the microprocessor will receive a T-fault alarm signal for one of the TEC driver and it is followed by an auto switch over to another thermistor, which has been in operation, for temperature reading without causing control process disruption. Of course, there can be many variations, alternatives, and modifications.

Although the above has been shown using a selected group of components for the TEC controller, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

Figure 8:
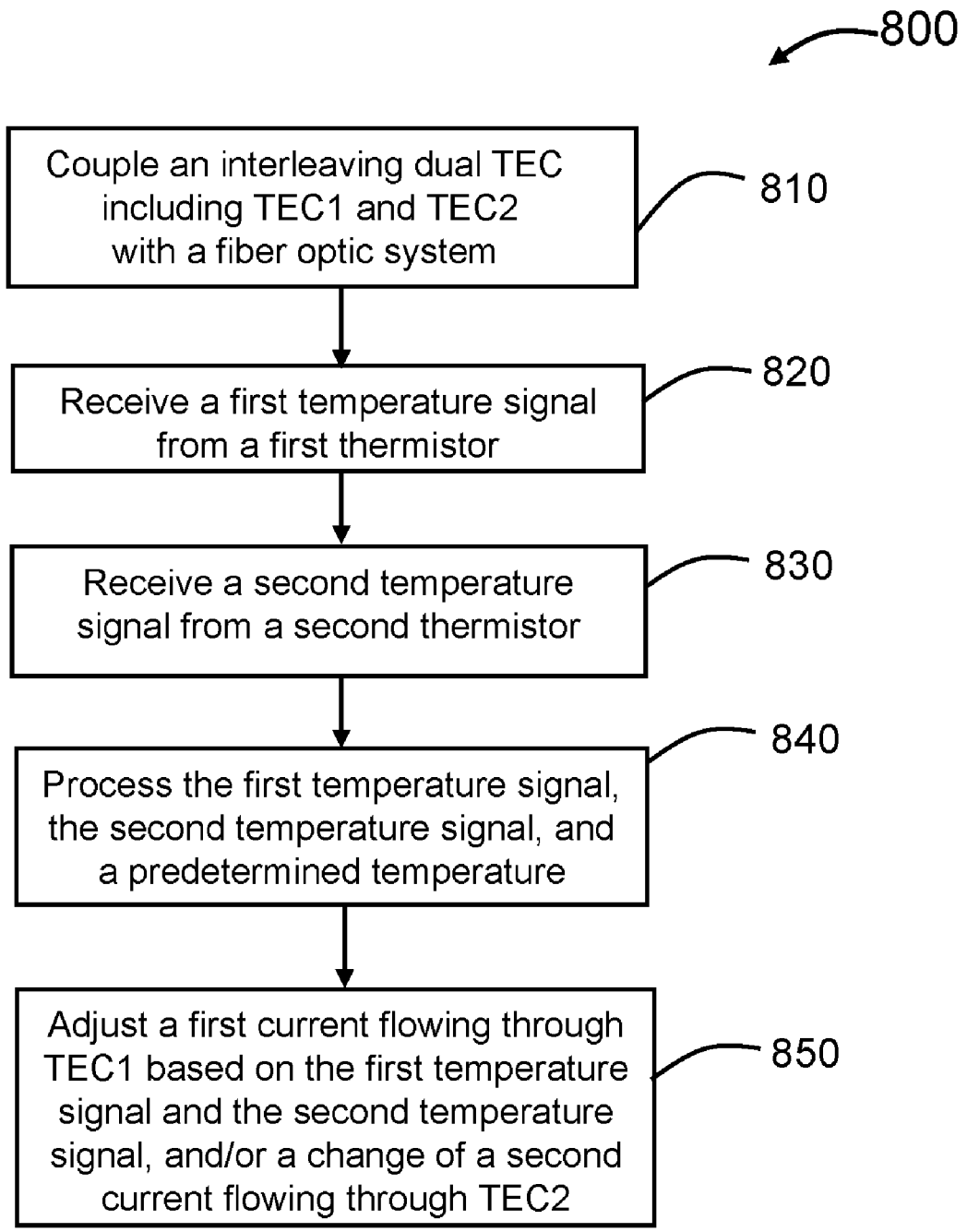
FIG. 8 is a simplified flowchart of a method for providing thermoelectric cooling for a fiber optic system according to an embodiment of the invention.

FIG. 8 is a simplified flowchart of a method for providing thermoelectric cooling for a fiber optic system according to an embodiment of the invention. This diagram is merely an example, which should not unduly limit the scope of the claims herein. One of ordinary skill in the art would recognize other variations, modifications, and alternatives. The method can be briefly outlined below, with reference to the flowchart in FIG. 8.

1. (Process 810) Couple an interleaving dual TEC apparatus including a TEC1 and a TEC2 with the fiber optic system;
2. (Process 820) Receive a first temperature signal from a first thermistor;
3. (Process 830) Receive a second temperature signal from a second thermistor;
4. (Process 840) Process information associated with a predetermined temperature, the first temperature signal, and the second temperature signal;
5. (Process 850) Adjust a first current flowing through the TEC1 based on at least the first temperature signal and the second temperature signal or based on a change in a second current flowing through the TEC2.

As shown, FIG. 8 provides a method of performing thermoelectric cooling of a fiber optic system according to an embodiment of the present invention. The method 800 includes (Process 810) coupling an interleaving dual TEC apparatus including a TEC1 and a TEC2 with the fiber optic system. In one embodiment, the TEC1 includes a first plurality of alternating P-type and N-type thermoelectric semiconductor blocks and the TEC2 includes a second plurality of alternating P-type and N-type thermoelectric semiconductor blocks. The first plurality of alternating P-type and N-type thermoelectric semiconductor blocks and the second plurality of alternating P-type and N-type thermoelectric semiconductor blocks can be configured to interleave each other into a single TEC package between two thermal plates. For example, the interleaving dual TEC apparatus used hear can be the interleaving dual TEC 500 shown in FIGS. 5A-5C. In another example, the interleaving dual TEC apparatus used here can be the interleaving dual TEC 600 shown in FIG. 6. In yet another example, one thermal plate associated with the interleaving dual TEC is mounted with a target surface of the fiber optic system that is to be cooled.

The method 800 further includes (Process 820) receiving a first temperature signal from a first thermistor and (Process 830) receiving a second temperature signal from a second thermistor. For example, the first thermistor and the second thermistor are coupled to the thermal plate of the TEC package that is in contact with one surface of the fiber optic system. In another example, the thermistors can be directly coupled to another surface of the first optic system. In yet another example, the first temperature signal and the second temperature signal are both sent to a TEC driver either for TEC1 and TEC2 depending on operation modes. The method also includes (Process 840) processing information associated with a predetermined temperature, the first temperature signal, and the second temperature signal. In particular, the TEC driver uses one temperature signal as reference and correct offset from another temperature signal comparing with a predetermined temperature value for the target surface. For example, the TEC driver may determine if one thermistor is failed or not and send T-fault signal to microprocessor if it dose occurs. Of course, there can be many variations, alternatives, and modifications.

Additionally, the method 800 includes (Process 850) adjusting a first current flowing through the TEC1 based on at least the first temperature signal and the second temperature signal or based on a change in a second current flowing through the TEC2. In one embodiment, two redundant TEC drivers will be used for adjusting the first current to TEC1 and the second current to TEC2. Depending on operation mode, the second current can be a minimum value as the TEC2 is put into a shutdown mode while the first current is at a proper high value to ensure the TEC1 working with full power. Whenever, one or more thermoelectric blocks within TEC1 fail, the first current may be disrupted and the second current needs to be automatically adjusted to ensure the TEC2 working with full power. In another mode, both the TEC1 and TEC2 are in operation but not working with full power. The first current supplied to TEC1 and the second current supplied to TEC2 may have different magnitude, depending on the specific interleaving configuration. Whenever, one TEC fails, the current supplied to another TEC needs to be automatically adjusted to resume the remaining TEC working with full power. Of course, there can be many variations, alternatives, and modifications.

Embodiments of the invention may provide further improvement of the redundant TEC design by staking one interleaving dual TEC on top of a regular TEC that is in direct contact with the heat sink. In an example, the interleaving dual TEC can be one including two independent sets of thermoelectric units as illustrated in FIGS. 5A-5C or FIG. 6 and discussed above. Under normal operation, the regular TEC can operate in a low power mode, acting merely as an efficient heat transfer device between the interleaving dual TEC and the heat sink. If one set of thermoelectric units within the interleaving dual TEC fails while the remaining set of thermoelectric units still works, the regular TEC at the bottom can be ramped up to offset the power loss from the TEC at the top. In this mode of operation, the TEC at the bottom often has a much longer MTTF and requires larger special dimensions than the one on top. Of course, there can be other variations, modifications, and alternatives.

Many benefits are achieved by way of the present invention over conventional techniques. For example, according to embodiments of the invention, a method and system is provided for improving the reliability of integrated Tx/Rx modules in fiber optic DWDM transport applications. Certain embodiments of the invention remove the reliability bottleneck in cases where these modules are used for full OEO at each PoP. In one embodiment, with the application of interleaving dual TEC along with 1:N protection, the reliability for OEO can be much improved can may be as an optional replacement an EDFA, making it more attractive to certain applications of optical transport industry. In another embodiment, the invention can also be used with individual transponders to further improve their reliability in applications of OEO system. When EDFAs are in use, a large number of TECs required in parallel may degrade the reliability of the OEO system as a whole. Embodiments of the invention provide advantages of the interleaving dual TEC configuration so that conventional technologies and low cost manufacturing processes can be applied without substantial modification. Of course, though the embodiments of the invention is shown for providing thermoelectric cooling for fiber optic system, one skilled in the art should recognize that the invention should have much broader range of applicability.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A thermoelectric cooler apparatus for a fiber optic system, the apparatus comprising:
   a first plate coupled to the fiber optic system;
   a second plate for coupling to a heat sink;
   a first plurality of thermoelectric units being sandwiched between the first plate and the second plate, the first plurality of thermoelectric units being connected to each other electrically in series;
   a second plurality of thermoelectric units being sandwiched between the first plate and the second plate, the second plurality of thermoelectric units being connected to each other electrically in series;
   wherein:
   the first plurality of thermoelectric units is electrically insulated, at least within the thermoelectric cooler apparatus, from the second plurality of thermoelectric units;
   the first plurality of thermoelectric units is configured to enhance or retard a heat transfer between the first plate and the second plate in response to a first current flowing through the first plurality of thermoelectric units;
   the second plurality of thermoelectric units is configured to enhance or retard the heat transfer between the first plate and the second plate in response to a second current flowing through the second plurality of thermoelectric units;
   the first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units, and an interleaved configuration of the first and second plurality of thermoelectric units is formed, such that the interleaved configuration provides uniform cooling and redundancy over a specific area.

2. The apparatus of claim 1 wherein the fiber optic system comprises a dense wavelength division multiplexing (DWDM) optical transport system.

3. The apparatus of claim 2 wherein the DWDM optical transport system comprises an arrayed waveguide multiplexer with integrated transmitters.

4. The apparatus of claim 2 wherein the DWDM optical transport system comprises an arrayed waveguide demultiplexer with integrated receivers.

5. The apparatus of claim 1 wherein both the first plate and the second plate are thermal conductors and electrical insulators.

6. The apparatus of 1 wherein the first plurality of thermoelectric units and the second plurality of thermoelectric units each includes a series of alternating P-type and N-type thermoelectric semiconductor blocks.

7. The apparatus of 6 wherein each thermoelectric unit includes a pair of P-type and N-type thermoelectric semiconductor block configured to from a Peltier diode.

8. The apparatus of claim 1 wherein the first plurality of thermoelectric units is in direct contact with the first plate.

9. The apparatus of claim 1 wherein the first plurality of thermoelectric units is not in electrical contact with the first plate.

10. The apparatus of claim 1 wherein the first current and the second current are different in magnitude.

11. The apparatus of claim 1 wherein the one or more of the second plurality of thermoelectric units is sandwiched by a first unit and a second unit of the first plurality of thermoelectric units within the cross section of the thermoelectric cooler apparatus.

12. A thermoelectric cooler apparatus for a fiber optic system, the apparatus comprising:
    a first plate coupled to the fiber optic system;
    a second plate for coupling to a heat sink;
    a first plurality of thermoelectric units being sandwiched between the first plate and the second plate, the first plurality of thermoelectric units being connected to each other electrically in series;
    a second plurality of thermoelectric units being sandwiched between the first plate and the second plate, the second plurality of thermoelectric units being connected electrically in series;
    wherein:
    the first plurality of thermoelectric units is electrically insulated from the second plurality of thermoelectric units;
    the first plurality of thermoelectric units is configured to enhance or retard a heat transfer between the first plate and the second plate in response to a first current flowing through the first plurality of thermoelectric units;
    the second plurality of thermoelectric units is configured to enhance or retard the heat transfer between the first plate and the second plate in response to a second current flowing through the second plurality of thermoelectric units;
    the first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units, and an interleaved configuration of the first and second plurality of thermoelectric units is formed, such that the interleaved configuration provides uniform cooling and redundancy over a specific area;
    a first thermistor coupled to the first plate and configured to output a first temperature signal;
    a second thermistor coupled to the first plate and configured to output a second temperature signal; and
    a processing apparatus configured to receive the first temperature signal and the second temperature signal, process information associated with a predetermined temperature, the first temperature signal, and the second temperature signal, and adjust the first current based on at least the first temperature signal and the second temperature signal or based on a change in the second current.

13. The apparatus of claim 12 wherein the fiber optic system comprises a hybrid integrated DWDM transmitter/receiver module.

14. The apparatus of claim 12 wherein the first plurality of thermoelectric units and the second plurality of thermoelectric units each includes a series of alternating P-type and N-type thermoelectric semiconductor blocks.

15. The apparatus of 14 wherein each thermoelectric unit includes a pair of P-type and N-type thermoelectric semiconductor block configured to from a Peltier diode.

16. The apparatus of claim 12 wherein both the first plate and the second plate are thermal conductors and electrical insulators.

17. The apparatus of claim 12 wherein the processing apparatus further comprises:
    a first TEC driver;
    a second TEC driver; and
    a microprocessor configured to control the first TEC-driver and the second TEC-driver independently;
    wherein:
    the first TEC driver is configured to receive the first temperature signal and the second temperature signal and adjust the first current in response to both the first temperature signal and the second temperature signal and/or the change in the second current; and
    the second TEC driver is configured to receive the first temperature signal and the second temperature signal and adjust the second current in response to both the first temperature signal and the second temperature signal and/or the change in the first current.

18. The apparatus of claim 17 wherein the change in the first/second current is caused at least by a failure of one or more of the first/second plurality of thermoelectric units or by an operational shut-down of the first/second TEC driver.

19. A method for providing thermoelectric cooling for a fiber optic system, the method comprising:
    coupling a thermoelectric cooler apparatus with the fiber optic system, the thermoelectric cooler apparatus including:
    a first plate coupled to the fiber optic system;
    a second plate coupled to a heat sink;
    a first plurality of thermoelectric units being sandwiched between the first plate and the second plate, the first plurality of thermoelectric units being connected to each other electrically in series;
    a second plurality of thermoelectric units being sandwiched between the first plate and the second plate, the second plurality of thermoelectric units being connected to each other electrically in series;
    wherein:
    the second plurality of thermoelectric units is insulated, at least within the thermoelectric cooler apparatus, from the first plurality of thermoelectric units;
    the first plurality of thermoelectric units and the second plurality of thermoelectric units are configured such that a cross-section of the thermoelectric cooler apparatus includes one or more of the second plurality of thermoelectric units being sandwiched by the first plurality of thermoelectric units, and an interleaved configuration of the first and second plurality of thermoelectric units is formed, such that the interleaved configuration provides uniform cooling and redundancy over a specific area;

receiving a first temperature signal from a first thermistor coupled to the first plate;

receiving a second temperature signal from a second thermistor coupled to the first plate;

processing information associated with a predetermined temperature, the first temperature signal, and the second temperature signal; and adjusting a first current flowing through the first plurality of thermoelectric units based on at least the first temperature signal and the second temperature signal or based on a change in a second current, the second current flowing through the second plurality of thermoelectric units.

20. The method of claim 19 wherein the process for adjusting the first current based on at least the first temperature signal and the second temperature signal or based on a change in the second current includes adjusting the first current based on at least the first temperature signal, the second temperature signal, and a change in the second current.

21. The method of claim 19 wherein the change in the second current is at least caused by a failure of one or more of the second plurality of thermoelectric units.

22. The method of claim 19, further comprising adjusting the second current based on at least the first temperature signal, the second temperature signal, and a change in the first current.

23. The method of claim 22 wherein the change in the first current is at least caused by a failure of one or more of the first plurality of thermoelectric units.

24. The method of claim 19 wherein the first plurality of thermoelectric units and the second plurality of thermoelectric units each includes a series of alternating P-type and N-type thermoelectric semiconductor blocks.

25. The method of claim 24 wherein each thermoelectric unit includes a pair of P-type and N-type thermoelectric semiconductor block configured to from a Peltier diode.

* * * * *